(12) United States Patent
Prima et al.

(10) Patent No.: US 8,981,516 B2
(45) Date of Patent: Mar. 17, 2015

(54) BACK-SIDE ILLUMINATED IMAGE SENSOR PROVIDED WITH A TRANSPARENT ELECTRODE

(75) Inventors: Jens Prima, Siegen (DE); François Roy, Seyssins (FR); Michel Marty, Saint Paul de Varces (FR)

(73) Assignees: STMicroeletronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/445,222

(22) Filed: Apr. 12, 2012

(65) Prior Publication Data

US 2012/0261783 A1 Oct. 18, 2012

(30) Foreign Application Priority Data

Apr. 12, 2011 (FR) ...................................... 11 53177

(51) Int. Cl.
*H01L 21/00* (2006.01)
*H01L 27/146* (2006.01)

(52) U.S. Cl.
CPC ...... *H01L 27/14603* (2013.01); *H01L 27/1463* (2013.01); *H01L 27/14643* (2013.01)
USPC ........... 257/447; 257/291; 257/292; 257/432; 438/70; 438/98; 438/160

(58) Field of Classification Search
USPC ........... 257/294, 432, 462, 447, 460, 75, 291, 257/292; 438/70, 98, 160
See application file for complete search history.

(56) References Cited

U.S. PATENT DOCUMENTS

| | | | |
|---|---|---|---|
| 2,200,084 A | 5/1940 | Hibbard | |
| 7,875,918 B2 | 1/2011 | Venezia et al. | |
| 2007/0052056 A1 | 3/2007 | Doi et al. | |
| 2009/0315132 A1 | 12/2009 | Kohyama | |
| 2010/0096718 A1* | 4/2010 | Hynecek et al. | 257/460 |
| 2010/0123069 A1 | 5/2010 | Mao et al. | |
| 2010/0148289 A1 | 6/2010 | McCarten et al. | |
| 2010/0193845 A1 | 8/2010 | Roy et al. | |
| 2010/0237451 A1 | 9/2010 | Murakoshi | |
| 2012/0025199 A1* | 2/2012 | Chen et al. | 257/75 |

FOREIGN PATENT DOCUMENTS

EP 1995783 A2 11/2008
WO WO 2009023603 A1 2/2009

OTHER PUBLICATIONS

French Search Report and Written Opinion dated Sep. 12, 2011 from corresponding French Application No. 11/53177.
French Search Report and Written Opinion dated Sep. 14, 2011 from related French Application No. 11/53183.
French Search Report and Written Opinion dated Sep. 14, 2011from related French Application No. 11/53179.
French Search Report and Written Opinion dated Sep. 15, 2011 from related French Application No. 11/53178.

* cited by examiner

*Primary Examiner* — Errol Fernandes
(74) *Attorney, Agent, or Firm* — Seed IP Law Group PLLC

(57) ABSTRACT

A back-side illuminated image sensor formed from a thinned semiconductor substrate, wherein: a transparent conductive electrode, insulated from the substrate by an insulating layer, extends over the entire rear surface of the substrate; and conductive regions, insulated from the substrate by an insulating coating, extend perpendicularly from the front surface of the substrate to the electrode.

17 Claims, 2 Drawing Sheets

BACK-SIDE ILLUMINATED IMAGE SENSOR PROVIDED WITH A TRANSPARENT ELECTRODE

CROSS REFERENCE TO RELATED APPLICATIONS

This application claims the priority benefit of French patent application number 11/53177, filed on Apr. 12, 2011, entitled BACK-SIDE ILLUMINATED IMAGE SENSOR PROVIDED WITH A TRANSPARENT ELECTRODE, which is hereby incorporated by reference to the maximum extent allowable by law.

BACKGROUND

1. Technical Field

Embodiments relate to a back-side illuminated image sensor.

2. Discussion of the Related Art

FIG. 1 is a cross-section view schematically and partially showing an example of a back-side illuminated image sensor 1, formed inside and on top of a thinned semiconductor substrate 3. In this example, substrate 3 is of type P. Its thickness, for example, ranges between 1 and 10 μm.

Insulating regions 5, for example made of silicon oxide, extend from the front side (the upper surface in the orientation of the drawings) to the back side of substrate 3, perpendicularly to these surfaces. Regions 5 form partitions delimiting, in top view, a plurality of substrate portions 3a and 3b. Each substrate portion 3a comprises at least one photodiode and may comprise charge transfer devices (not shown), corresponding to a pixel of the sensor, and each substrate portion 3b comprises one or several control transistors (not shown). Regions 5 have the function of insulating substrate portions 3a and 3b from one another. They especially enable to avoid for electrons generated in a given substrate portion 3a, due to the illumination of this substrate portion, to be collected by a photodiode of another substrate portion 3a.

The front surface of substrate 3 is coated with a stack 7 of insulating and conductive layers in which various interconnections of the sensor are formed. It should in particular be noted that stack 7 comprises contacting areas (not shown), enabling to bias substrate portions 3a and 3b to a common reference voltage.

The rear surface of substrate 3 is coated with a thin insulating layer 9, for example, made of silicon oxide, itself coated with an antireflection layer 11, for example formed of a stack of several transparent dielectric layers of different indexes. Antireflection layer 11 is covered with juxtaposed color filters, altogether forming a filtering layer 13. In the shown example, a first pixel is topped with a green filter (G) and a second neighboring pixel is topped with a blue filter (B). Microlenses 15 are stacked on filtering layer 13, to concentrate the received light rays towards the photodiodes.

A disadvantage of this type of sensor lies in the presence in the substrate of eddy currents, called dark currents, which may result in malfunctions and/or in altering the sensor performance. Dark currents are due to the spontaneous random generation of electron-hole pairs at the level of certain defects of the crystal structure of the substrate. Such current are capable of appearing even in the absence of any illumination of the sensor. They are more specifically generated at the interfaces between substrate 3 and insulating regions 5 and 9, which are areas with a great concentration of crystal defects.

To decrease dark currents, it has been provided to heavily dope, by implantation, strips of substrate 3 at the interfaces with regions 5 and insulating layer 9. However, the provision of these implantations has various disadvantages. In particular, the presence of a heavily-doped strip on the side of the substrate surface exposed to light alters the sensor sensitivity, especially in blue or ultraviolet wavelength ranges, where the photons are absorbed by very small substrate thicknesses. Further, the presence of such strips of heavy doping level, at the periphery of substrate portions 3a and 3b, tends to affect the behavior of the sensor transistors, and more specifically to inappropriately modify their threshold voltage. Further, the provision of an implantation on the rear surface side of the sensor raises technical issues.

SUMMARY

An embodiment provides a back-side illuminated image sensor, which overcomes at least some of the disadvantages of existing sensors.

An embodiment provides such a sensor having decreased dark currents with respect to existing sensors.

An embodiment provides such a sensor which has a better sensitivity than existing sensors.

An embodiment provides such a sensor which comprises no implanted areas of a doping level greater than that of the substrate on the rear surface side of the substrate.

Thus, an embodiment provides a back-side illuminated image sensor formed from a thinned semiconductor substrate, wherein: a transparent conductive electrode, insulated from the substrate by an insulating layer, extends over the entire rear surface of the substrate; and conductive regions, insulated from the substrate by an insulating coating, extend perpendicularly from the front surface of the substrate to the electrode.

According to an embodiment, contacting areas are arranged on the front surface side of the conductive regions, and are capable of biasing, in operation, these regions and the electrode to a same voltage.

According to an embodiment, the conductive regions delimit substrate portions inside and on top of which are formed photodiodes and control transistors of the sensor.

According to an embodiment, the thickness of the insulating layer and the thickness of the insulating coating are substantially identical.

According to an embodiment, the conductive regions are made of doped polysilicon.

According to an embodiment, the electrode is made of indium-tin oxide.

According to an embodiment, the substrate is of type P.

Another embodiment provides the use of such a sensor wherein the substrate is biased to a first voltage, the conductive regions and the electrode being biased to a second voltage smaller than the first voltage.

According to an embodiment, different substrate portions are biased to different voltages.

The foregoing and other objects, features, and advantages will be discussed in detail in the following non-limiting description of specific embodiments in connection with the accompanying drawings.

DETAILED DESCRIPTION

Figure 1:
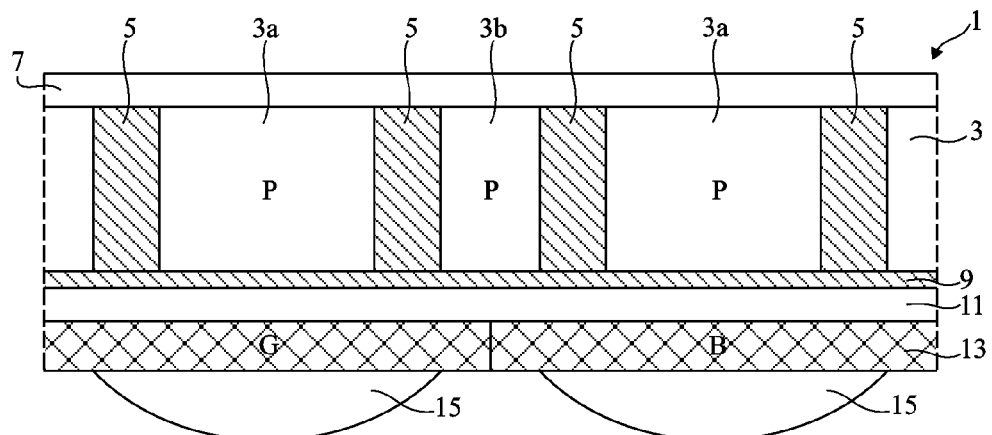
FIG. 1, previously described, is a cross-section view schematically and partially showing a back-side illuminated image sensor.

For clarity, the same elements have been designated with the same reference numerals in the different drawings and, further, as usual in the representation of integrated circuits, the various drawings are not to scale.

Figure 2:
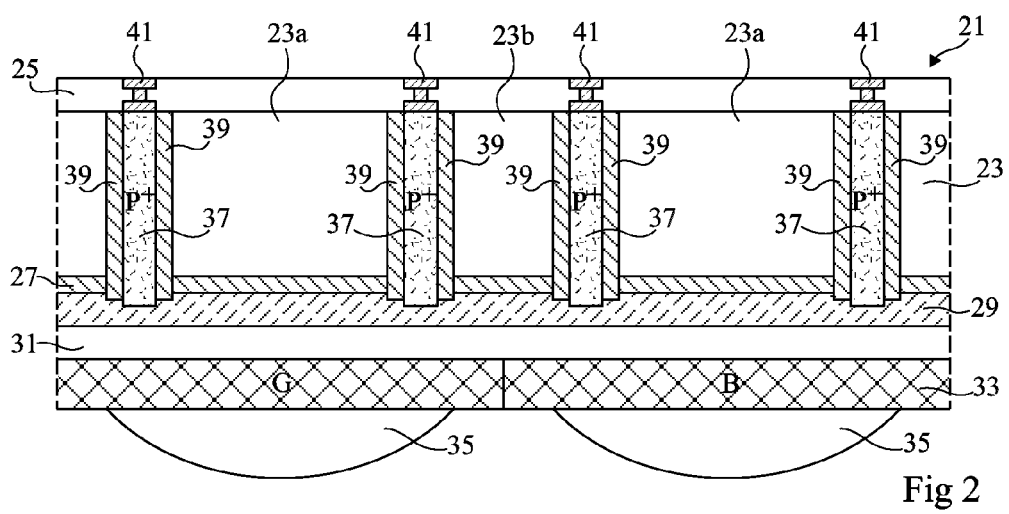
FIG. 2 is a cross-section view schematically and partially showing an embodiment of a back-side illuminated image sensor.

FIG. 2 is a cross-section view schematically and partially showing an embodiment of a back-side illuminated image sensor 21. Sensor 21 is formed inside and on top of a thinned semiconductor substrate 23, for example, a lightly-doped P-type silicon substrate. The thickness of substrate 23 for example ranges between 1 and 10 µm. The front surface of to substrate 23 is coated with a stack 25 of insulating and conductive layers, in which are formed various interconnections of the sensor. The rear surface of substrate 23 is coated with a thin insulating layer 27, for example, made of silicon oxide, itself coated with a transparent conductive layer 29, for example, made of indium-tin oxide (generally designated in the art as ITO). In this example, layer 29 is coated with an antireflection layer 31, itself coated with juxtaposed color filters altogether forming a filtering layer 33, and microlenses 35 are stacked on filtering layer 33 to concentrate the light towards the photosensitive areas of the sensor.

Conductive regions 37, for example, made of polysilicon of same conductivity type as the substrate but of higher doping level, extend from the front surface of substrate 23, substantially perpendicularly to this surface, all the way to layer 29. Regions 37 are insulated from substrate 23 by an insulating coating 39, for example, made of silicon oxide, preferably of same thickness as layer 27. The rear surface of regions 37 is in contact with conductive layer 29. Regions 37 and their insulating coating 39 form together a plurality of substrate portions 23a and 23b. As an example, each substrate portion 23a comprises at least one photodiode and may comprise charge transfer devices (not shown), corresponding to a pixel of the sensor, and each substrate portion 23b comprises one or several control transistors (not shown). In this example, each region 37 is topped with a biasing contacting area 41, formed in interconnection stack 25 and contacting its front surface. Other interconnection tracks and vias, not shown, are of course provided in stack 25. It should in particular be noted that stack 25 comprises contacting areas (not shown), enabling to bias substrate portions 23a and 23b.

In operation, regions 37 and transparent conductive layer 29 may be biased to a same voltage, via contacting areas 41. In particular, they may be biased to a voltage different from the biasing voltage of substrate portions 23a, 23b. The conductive layer formed by regions 37 and 29, the intermediary dielectric layer formed by insulating regions 39 and 27, and the conductive layer formed by substrate 23 altogether form a capacitance totally surrounding the lateral and rear surfaces of substrate portions 23a, 23b.

In this example, a negative voltage with respect to the substrate bias voltage is applied onto areas 41, to push back towards the photodiodes the electrons which might be generated close to the rear surface of the substrate. This enables to improve the sensor sensitivity, since if photons are absorbed close to the interface between substrate 23 and insulating layer 27, the generated electrons will not be trapped or recombined at the interface but will be pushed back towards the upper portion of the substrate to be collected by a photodiode.

Further, the biasing, negative with respect to the substrate, of regions 37 and 29, creates an enrichment in the substrate areas opposite to these regions, which amounts to forming a more heavily-doped P region (the thickness of the enriched area depends on the applied voltage). This prevents the spontaneous generation of electron-hole pairs at the level of the lateral and rear surfaces of substrate portions 23a and 23b. This results in a significant decrease in dark currents with respect to usual sensors. Further, the enriched area thus obtained may be much thinner than the heavily-doped strips of usual sensors, created by implantation of doped elements from the rear surface. This especially enables to improve the sensor sensitivity in wavelengths for which the photons are absorbed by very small silicon thicknesses. As an example, in operation, substrate portions 23a and 23b may be biased to 0 V, and areas 41 to −5 V.

Another advantage of the provided structure is that the biasing of transparent electrode 29 coating the rear surface of the sensor is performed via areas 41 formed on the front surface side. This enables to avoid the provision of a contacting area on the sensor side exposed to light.

It should be noted that the provided structure enables to provide an operating mode where the bias voltage of substrate portions 23a and 23b is not the same for all the sensor pixels. This, in particular, enables to adjust the thickness of the enriched strip formed on the lateral and rear surfaces of substrate portions 23a, 23b, according to various criteria such as the pixel color and/or the pixel position on the sensor.

FIGS. 3A to 3D are cross-section views schematically and partially showing steps of an example of a method for forming an image sensor 31 of the type described in relation with FIG. 2.

Figure 3A:
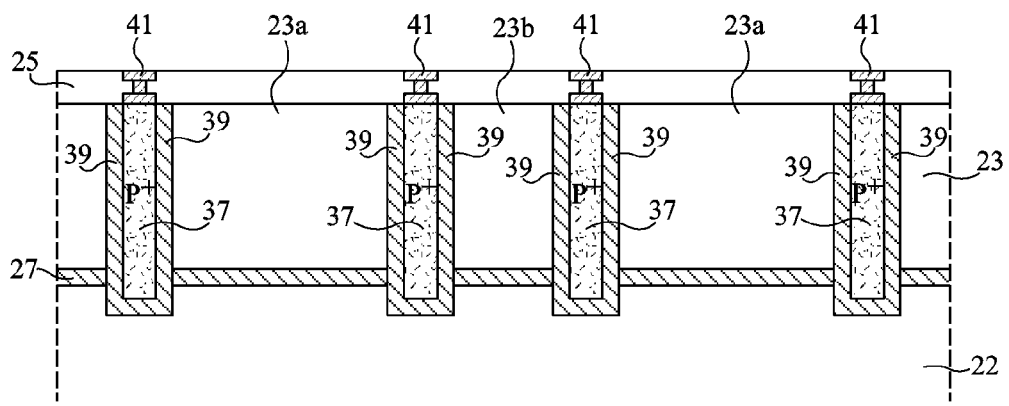
FIGS. 3A to 3D are cross-section views schematically and partially showing steps of a method for forming a back-side illuminated image sensor.

FIG. 3A illustrates the forming of various sensor components from the front surface of a semiconductor substrate of standard thickness. In this example, the original substrate is a substrate of semiconductor on insulator type, comprising a silicon support 22 coated with a thin oxide layer 27, itself coated with a lightly-doped P-type epitaxial layer 23. In a subsequent thinning step, support 22 will be totally removed, and only insulating layer 27 and epitaxial layer 23 will be kept. Thus, epitaxial layer 23 forms the sensor substrate.

Heavily-doped P-type polysilicon regions 37 are formed in the upper portion of the substrate. Regions 37 extend from the front surface of the substrate and perpendicularly to this surface. In this example, they cross epitaxial layer 23 and insulating layer 27, and slightly extend into support 22. To form regions 37, trenches are opened in the substrate down to the desired depth, for example, by etching. An insulating coating 39, for example, made of silicon oxide, is formed on the lateral walls and at the bottom of the trenches. The trenches are then filled with doped polysilicon. Photodiodes and control transistors (not shown) are formed from the front surface, inside and on top of substrate 23, either before or after the forming of regions 37.

After the forming of regions 37, of the photodiodes, and of the control transistors, the front surface of substrate 23 is covered with a stack 25 of insulating and conductive layers in which the various interconnections of the sensor are formed. In particular, in the shown example, stack 25 comprises conductive tracks 41 contacting the front surface of regions 37.

Figure 3B:
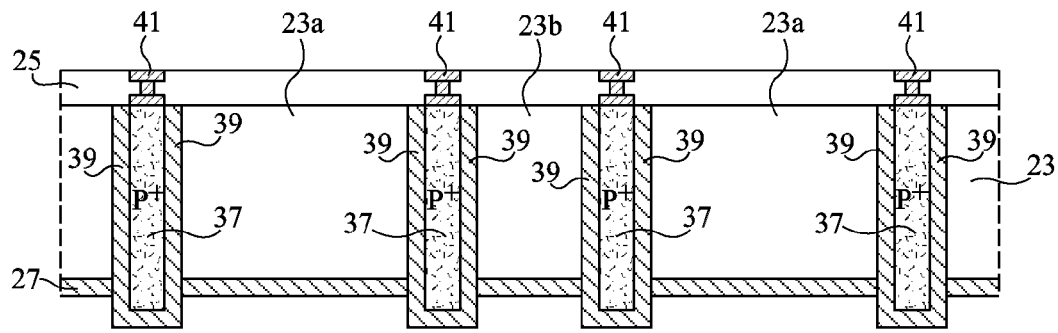

FIG. 3B illustrates a substrate thinning step, subsequent to the forming of stack 25. A holding handle (not shown) is bonded onto the upper surface of stack 25, and the substrate is thinned from its back side to reach insulating layer 27. It should be noted that the last part of the thinning is performed by selective etching of silicon support 22 over silicon oxide layer 27. Since this etching does not etch insulating layer 39, polysilicon regions 37 and their coating 39 form slight protrusions on the rear surface side of the thinned substrate.

Figure 3C:
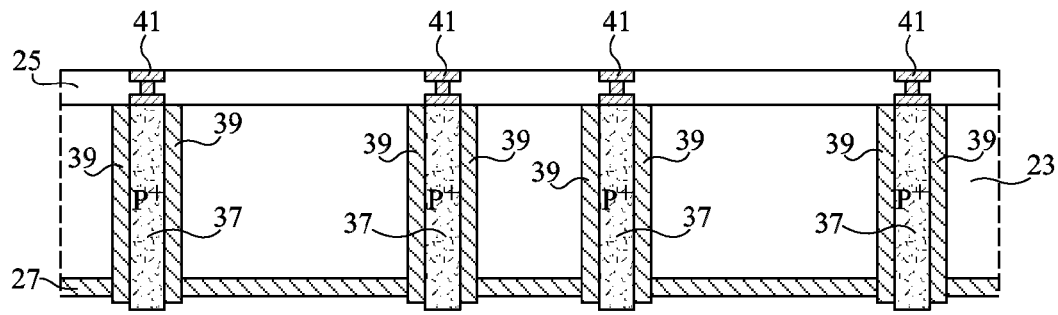

FIG. 3C illustrates a subsequent step of removal of the portion of coating 39 covering the rear surface of polysilicon regions 37. This removal is performed, for example, by chem.-mech. polishing. At the end of this step, the rear surface of polysilicon regions 37 is exposed.

Figure 3D:
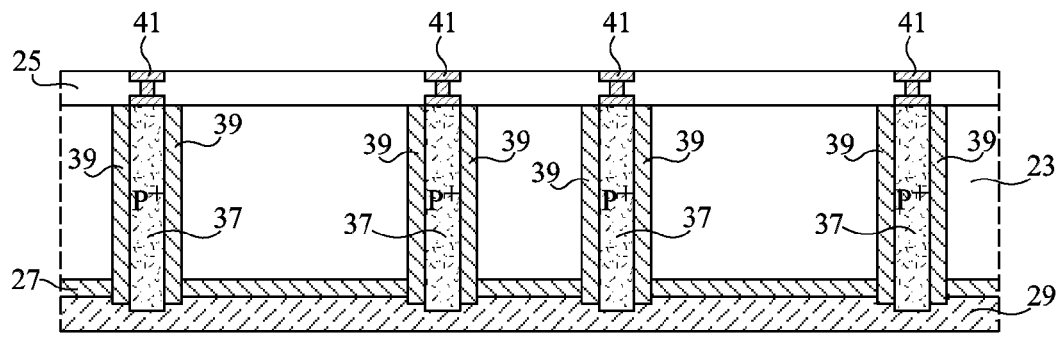

FIG. 3D illustrates a subsequent step of forming of a transparent conductive layer 29, for example, of indium-tin oxide (ITO), on the rear surface side. Layer 29 forms a transparent electrode coating the entire rear surface side of the sensor. In particular, layer 29 is in contact with the rear surface of polysilicon regions 37.

Final manufacturing steps, not shown, may be provided to obtain a sensor of the type described in relation with FIG. 2, especially comprising the forming of an antireflection layer, of color filtering elements, and of microlenses.

Specific embodiments have been described. Various alterations, modifications and improvements will readily occur to those skilled in the art.

In particular, embodiments are not limited to the manufacturing method example described in relation with FIGS. 3A to 3D, where the sensor is formed from a substrate of semiconductor-on-insulator type. It will be within the abilities of those skilled in the art to form a sensor of the type described in relation with FIG. 2 from any other type of substrate capable of being thinned from its rear surface, for example, a solid silicon substrate possibly coated with an epitaxial layer. In particular, if insulating layer 27 is not preexisting in the substrate, it will be within the abilities of those skilled in the art to form this layer in a step subsequent to the substrate thinning.

Further embodiments are not limited to the above-described example where the sensor is formed from a P-type substrate. It will be within the abilities of those skilled in the art to adapt the provided method to form a sensor from an N-type substrate. In particular, in operations, regions 37 and electrode 29 will then have to be positively biased with respect to the substrate.

Moreover, embodiments are not limited to the above-described example, where contacting areas 41 are provided on the front surface of each of polysilicon regions 37. It will be within the abilities of those skilled in the art to provide other configurations, and especially to decrease the number of contacting areas provided for the biasing of regions 37 and of conductive layer 29.

Further, it will be within the abilities of those skilled in the art to adapt the provided structure by replacing the doped polysilicon of regions 37 with any other adapted conductive material.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A back-side illuminated image sensor formed from a thinned semiconductor substrate, wherein:
   a transparent conductive electrode, insulated from the substrate by an insulating layer, extends over the entire rear surface of the substrate; and
   conductive regions, insulated from the substrate by an insulating coating, that extend perpendicularly from the front surface of the substrate to the electrode, and surround a portion of the substrate on at least two sides,
   wherein said conductive regions delimit a first substrate portion, inside and/or on top of which are formed photodiodes, and a second substrate portion, inside and/or on top of which are formed control transistors of the sensor.

2. The sensor of claim 1, wherein contacting areas are arranged on the front surface side of said conductive regions, and are capable of biasing, in operation, said regions and said electrode to a same voltage.

3. The sensor of claim 1, wherein the thickness of the insulating layer and the thickness of the insulating coating are substantially identical.

4. The sensor of claim 1, wherein said conductive regions are made of doped polysilicon.

5. The sensor of claim 1, wherein said electrode is made of indium-tin oxide.

6. The sensor of claim 1, wherein said substrate is of type P.

7. A use of the sensor of claim 6, wherein the substrate is biased to a first voltage, the conductive regions and the electrode being biased to a second voltage smaller than the first voltage.

8. A use of the sensor of claim 1, wherein different substrate portions are biased to different voltages.

9. The sensor of claim 1, further comprising at least two unit pixels electrically separated by the conductive regions.

10. A back-side illuminated image sensor formed from a thinned semiconductor substrate, comprising:
    a transparent conductive electrode, insulated from the substrate by an insulating layer, extends over the entire rear surface of the substrate; and
    conductive regions, insulated from the substrate by an insulating coating, that surround one or more photodiodes corresponding to a single unit pixel of the image sensor on at least two sides,
    wherein said conductive regions delimit a first substrate portion, inside and/or on top of which are formed photodiodes, and a second substrate portion, inside and/or on top of which are formed control transistors of the sensor.

11. The sensor of claim 10, wherein contacting areas are arranged on the front surface side of said conductive regions, and are capable of biasing, in operation, said regions and said electrode to a same voltage.

12. The sensor of claim 10, wherein the thickness of the insulating layer and the thickness of the insulating coating are substantially identical.

13. The sensor of claim 10, wherein said conductive regions are made of doped polysilicon.

14. The sensor of claim 10, wherein said electrode is made of indium-tin oxide.

15. The sensor of claim 10, wherein said substrate is of type P.

16. The sensor of claim 10, wherein the conductive regions extend perpendicularly from the front surface of the substrate to the electrode.

17. The sensor of claim 10, further comprising at least two unit pixels electrically separated by the conductive regions.

* * * * *